US012100933B2

(12) United States Patent
Luo et al.

(10) Patent No.: US 12,100,933 B2
(45) Date of Patent: Sep. 24, 2024

(54) TUNABLE LASER ASSEMBLY INCLUDING TUNABLE SEMICONDUCTOR LASER APPARATUS AND PHOTODETECTOR OUTSIDE OF LASER HOUSING

(71) Applicant: InnoLight Technology PTE. LTD., Singapore (SG)

(72) Inventors: Liang Luo, Jiangsu (CN); Wenkai Tu, Jiangsu (CN); Jinan Gu, Jiangsu (CN); Yuzhou Sun, Jiangsu (CN)

(73) Assignee: INNOLIGHT TECHNOLOGY PTE. LTD., Singapore (SG)

( * ) Notice: Subject to any disclaimer, the term of this patent is extended or adjusted under 35 U.S.C. 154(b) by 762 days.

(21) Appl. No.: 16/944,451

(22) Filed: Jul. 31, 2020

(65) Prior Publication Data

US 2021/0036487 A1 Feb. 4, 2021

(30) Foreign Application Priority Data

Aug. 2, 2019 (CN) .......................... 201910712116.0

(51) Int. Cl.
*H01S 5/0687* (2006.01)
*H01S 3/139* (2006.01)
(Continued)

(52) U.S. Cl.
CPC ............ *H01S 5/0687* (2013.01); *H01S 3/139* (2013.01); *H01S 5/02325* (2021.01);
(Continued)

(58) Field of Classification Search
CPC .... H01S 5/0687; H01S 3/139; H01S 5/02325; H01S 5/141; H01S 5/02208; H01S 5/02251; H01S 5/02415; H01S 5/1096
See application file for complete search history.

(56) References Cited

U.S. PATENT DOCUMENTS 5,432,537 A * 7/1995 Imakawa ................. B41J 2/465
347/135
7,974,539 B2 * 7/2011 Song .................... G02B 6/4246
398/164

(Continued)

FOREIGN PATENT DOCUMENTS

| CN | 104078836 A | 10/2014 |
| JP | 2004-111859 A | 4/2004 |
| JP | 2004-179427 A | 6/2004 |

*Primary Examiner* — M. A. Golub-Miller
(74) *Attorney, Agent, or Firm* — Finnegan, Henderson, Farabow, Garrett & Dunner, LLP (57) ABSTRACT

A tunable laser includes a housing having a sealable accommodating cavity, an optical interface and an electrical interface disposed on the housing, a tunable semiconductor laser apparatus, a splitter component, and a photodetector. The tunable semiconductor laser apparatus is disposed in the accommodating cavity for emitting an optical signal whose wavelength is tunable. An electrical signal inputted through the electrical interface controls the tunable semiconductor laser apparatus to emit the optical signal. The optical signal is outputted through the optical interface. The splitter component and the photodetector are disposed outside the housing. The optical signal is split into at least two beams of light by the splitter component after the optical signal is outputted through the optical interface. The photodetector is configured to receive one of the beams of light to monitor the optical signal emitted by the tunable semiconductor laser apparatus.

5 Claims, 3 Drawing Sheets

(51) Int. Cl.
*H01S 5/02208* (2021.01)
*H01S 5/02251* (2021.01)
*H01S 5/02325* (2021.01)
*H01S 5/024* (2006.01)
*H01S 5/10* (2021.01)
*H01S 5/14* (2006.01)

(52) U.S. Cl.
CPC .......... *H01S 5/141* (2013.01); *H01S 5/02208* (2013.01); *H01S 5/02251* (2021.01); *H01S 5/02415* (2013.01); *H01S 5/1096* (2013.01)

(56) References Cited

U.S. PATENT DOCUMENTS

| | | | |
|---|---|---|---|
| 8,462,823 B2 | 6/2013 | Daiber et al. | |
| 8,810,866 B2* | 8/2014 | Fujii | H01S 5/02257 385/136 |
| 2003/0161366 A1* | 8/2003 | Fu | H01S 5/02326 372/36 |
| 2003/0174962 A1* | 9/2003 | Poole | G02B 6/2852 385/48 |
| 2006/0215716 A1* | 9/2006 | Luo | H01S 5/0687 372/38.08 |
| 2009/0067778 A1* | 3/2009 | Kim | G02B 6/12007 385/14 |
| 2009/0162054 A1* | 6/2009 | Oguma | H04B 10/07955 398/34 |
| 2009/0242772 A1* | 10/2009 | Wang | G02B 6/359 359/227 |
| 2009/0323149 A1* | 12/2009 | Mizukami | G02B 6/29313 359/225.1 |
| 2011/0032955 A1* | 2/2011 | Daiber | H01S 5/02446 372/20 |
| 2011/0182305 A1* | 7/2011 | Daiber | H01S 5/02325 372/20 |
| 2011/0199454 A1* | 8/2011 | Ichii | G01J 1/32 359/205.1 |
| 2011/0200288 A1* | 8/2011 | Poole | G02B 6/4248 385/94 |
| 2011/0228035 A1* | 9/2011 | Ishii | B41J 2/45 359/205.1 |
| 2013/0062510 A1* | 3/2013 | Fujii | G01J 1/0403 361/748 |
| 2013/0177034 A1 | 7/2013 | Liu et al. | |
| 2014/0254973 A1* | 9/2014 | Hatta | G02B 6/4265 385/3 |
| 2015/0255952 A1* | 9/2015 | Chaouch | H01S 5/0683 372/20 |
| 2016/0112137 A1* | 4/2016 | Pfnuer | H04B 10/503 398/183 |
| 2016/0233646 A1* | 8/2016 | Daiber | H01S 5/141 |
| 2017/0363813 A1* | 12/2017 | Lee | G02B 6/3588 |
| 2018/0278014 A1* | 9/2018 | Komatsu | H04B 10/501 |
| 2020/0003978 A1* | 1/2020 | Kewitsch | G02B 6/255 |
| 2021/0036489 A1* | 2/2021 | Tu | H01S 5/02251 |

\* cited by examiner

TUNABLE LASER ASSEMBLY INCLUDING TUNABLE SEMICONDUCTOR LASER APPARATUS AND PHOTODETECTOR OUTSIDE OF LASER HOUSING

CROSS-REFERENCE TO RELATED APPLICATION

This application is based upon and claims priority to Chinese Patent Application 201910712116.0, filed on Aug. 2, 2019, the entire content of which is incorporated herein by reference.

FIELD OF THE DISCLOSURE

The present disclosure relates to the field of optical communication technology and, more particularly, to a tunable laser and an optical module.

BACKGROUND

Rapid development in big data, Internet of things, and 5G business has led to increasing demand for network capacity. As a result, coherent optical communication technology that features large bandwidth and long-distance transmission has become a top choice for the next generation of high-speed and large-capacity network. A narrow linewidth tunable laser, that serves as a highly coherent light source and local oscillator, has become a core part for coherent optical communication. Currently, coherent optical modules are mostly packaged in forms such as CFP2-ACO (C form-factor pluggable 2—analog coherent optics) and CFP-DCO (C form-factor pluggable—digital coherent optics). To further reduce package size, as in an OSFP (Octal Small Form Factor Pluggable) package for example, an integratable tunable laser assembly (ITLA) needs to be made even smaller into a nano-ITLA due to the restricting effect of the sizes of parts inside the module. Therefore, simpler and smaller optical designs are needed.

At present, solutions for narrow linewidth tunable lasers for commercial use primarily include free-space optical external cavity lasers, distributed Bragg reflector lasers, and distributed feedback laser arrays. Since tunable lasers have precise parameters and are sensitive to the environment, the packages typically employ hermetic solutions, and their sizes vary depending on the means of realization of their external cavities. Optical components in a hermetically sealed housing primarily include a gain chip, a wavelength selector, a wavelength locker, and a temperature controller, etc. The wavelength locker may employ a dither locking solution or a fixed-grid locking solution. Parts used in the dither locking solution include a cavity length dither component, a cavity length actuating component, and a monitor photo detector/diode (MPD) feedback component. The working mechanism of the dither locking solution is the cavity length actuating component changing a cavity length so that the MPD detects a minimum dither signal generated by cavity length dithering. Parts used in the fixed-grid locking solution include two MPDs and a fixed-grid filter. The working mechanism of the fixed-grid locking solution is one of the MPDs detecting a directly output light, the other MPD detect an output light that passes through the fixed grid, and mode locking by controlling the ratio of the foregoing. Regardless of which solution is used in the tunable laser, MPD feedback is necessary and takes up a large space. But too many components in the housing make it impossible to further reduce size.

SUMMARY

Purposes of the present disclosure include providing a tunable laser and an optical module that have a smaller package size by having a MPD placed outside a housing of the tunable laser.

To achieve one or more of the aforementioned purposes, one embodiment of the present disclosure provides a tunable laser including:
a housing having a sealable accommodating cavity;
an optical interface disposed at one end of the housing;
an electrical interface disposed at another end or a side of the housing;
a tunable semiconductor laser apparatus disposed in the accommodating cavity and configured to emit an optical signal whose wavelength is tunable, an electrical signal inputted through the electrical interface controlling the tunable semiconductor laser apparatus to emit the optical signal, the optical signal being outputted through the optical interface;
a splitter component disposed outside the housing and configured to split the optical signal outputted through the optical interface into at least two beams of light; and
a photodetector disposed outside the housing and configured to receive one of the beams of light to monitor the optical signal emitted by the tunable semiconductor laser apparatus.

Another embodiment of the present disclosure provides an optical module including an outer housing, a module circuit board, and a tunable laser. The tunable laser includes:
a sealed housing having an optical interface and an electrical interface;
a tunable semiconductor laser apparatus disposed in the sealed housing and configured to emit an optical signal whose wavelength is tunable, an electrical signal inputted through the electrical interface controlling the tunable semiconductor laser apparatus to emit the optical signal, the optical signal being outputted through the optical interface;
a splitter component disposed outside the sealed housing and configured to split the optical signal outputted through the optical interface into at least two beams of light; and
a photodetector disposed outside the sealed housing and configured to receive one of the beams of light to monitoring the optical signal emitted by the tunable semiconductor laser apparatus.

DETAILED DESCRIPTION

The text below provides a detailed description of the present disclosure with reference to specific embodiments illustrated in the attached drawings. However, these embodiments do not limit the present disclosure; the scope of protection for the present disclosure covers changes made to the structure, method, or function by persons having ordinary skill in the art on the basis of these embodiments.

In order to facilitate the presentation of the drawings in the present disclosure, the sizes of certain structures or portions have been enlarged relative to other structures or portions. Therefore, the drawings in the present application are only for the purpose of illustrating the basic structure of the subject matter of the present application.

Additionally, terms in the text indicating relative spatial position, such as "upper," "above," "lower," "below," and so forth, are used for explanatory purposes in describing the relationship between a unit or feature depicted in a drawing with another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

First Example Embodiment

Figure 1:
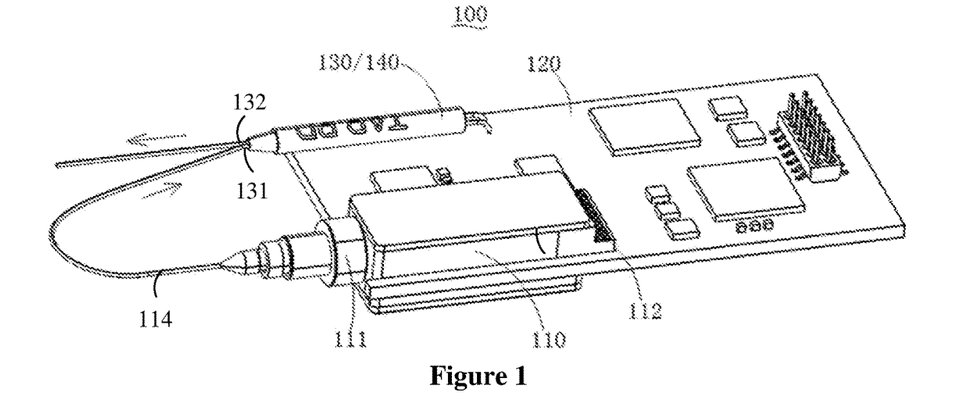
FIG. 1 is a diagram illustrating a tunable laser according to a first example embodiment of the present disclosure.
Figure 2:
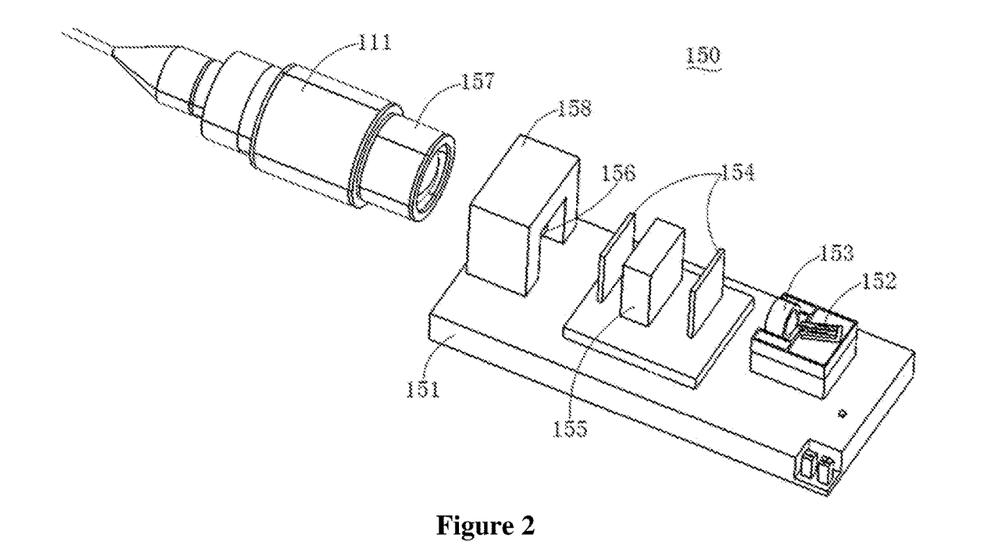
FIG. 2 is a structural diagram illustrating a tunable semiconductor laser apparatus according to the first example embodiment of the present disclosure.

FIG. 1 is a diagram illustrating a tunable laser 100 according to a first example embodiment of the present disclosure. FIG. 2 is a structural diagram illustrating a tunable semiconductor laser apparatus 150 according to the first example embodiment. As illustrated in FIGS. 1 and 2, the first example embodiment provides the tunable laser 100 having a small package size. The tunable laser 100 includes a housing 110, an optical interface 111, an electrical interface 112, the tunable semiconductor laser apparatus 150, a splitter component 130, a photodetector 140, and a circuit board 120. The housing 110 has a sealable accommodating cavity, and the tunable semiconductor laser apparatus 150 is disposed in the accommodating cavity for emitting an optical signal whose wavelength is tunable. The circuit board 120, such as a printed circuit board (PCB), is disposed outside the housing 110, and a processor, a controller, a memory, a driver, relevant circuits and components, etc. are disposed on the circuit board 120. The optical interface 111 is disposed at one end of the housing 110 for outputting the optical signal. The electrical interface 112 is disposed at another end of the housing 110 and electrically connected to the circuit board 120 disposed outside the housing 110 for receiving and transmitting an electrical signal. The splitter component 130 and the photodetector 140 are disposed on the circuit board outside the housing 110 and serve as a feedback assembly of the tunable laser 100.

In the first example embodiment, the splitter component 130 and the photodetector 140 are packaged as a Tap Photo Detector (Tap-PD) 130/140. In other words, the feedback assembly uses the Tap-PD 130/140 to provide both splitting and monitoring functions. The Tap-PD 130/140 is disposed on and electrically connected to the circuit board 120. In another example embodiment, the Tap-PD 130/140 may be disposed beside the circuit board 120. The Tap-PD 130/140 includes an optical input port 131 and an optical output port 132. The optical interface 111 at one end of the housing 110 is connected to the optical input port 131 of the Tap-PD 130/140 by means of an optical fiber 114. A light beam outputted from the optical interface 111 is inputted into the Tap-PD 130/140 through the optical input port 131 and is split into two portions of light: the portion that has lower power serves as a monitor light and is received and converted to an electrical signal by the Tap-PD 130/140; and the portion that has higher power serves as a signal light and is outputted from the optical output port 132. The optical power of the monitor light used for monitoring may account for 0.5% to 10% of the optical power of the optical signal outputted from the optical interface 111. In the first example embodiment, the optical power of the monitor light that is produced through splitting by the Tap-PD 130/140 and used for monitoring accounts for 1% to 2% of the optical power of the optical signal outputted from the optical interface 111. The use of the Tap-PD 130/140 as the feedback assembly results in lower optical insertion loss and polarization dependent loss and provides a wide range of operating wavelengths, good linearity, good thermal properties, a small package size, and a high level of integration.

In operation, electrical signals such as drive and control signals on the circuit board 120 are inputted into the housing 110 through the electrical interface 112. The electrical signals control the tunable semiconductor laser apparatus 150 to emit the optical signal, and the optical signal is outputted through the optical interface 111. The optical signal outputted from the optical interface 111 is inputted into the Tap-PD 130/140 through the optical input port 131 of the Tap-PD 130/140 and is split into two portions of light: the portion that has higher power serves as the signal light and is outputted from the optical output port 132; and the portion that has lower power serves as the monitor light which is received and converted to the electrical signal by the Tap-PD 130/140, and is used to monitor the optical signal emitted by the tunable semiconductor laser apparatus 150. The Tap-PD 130/140 converts the monitor light received into the electrical signal and transmits the electrical signal to the processor on the circuit board 120. The electrical signal is analyzed and processed by the processor and then fed back to the controller on the circuit board 120. The controller controls the tunable semiconductor laser apparatus 150 according to the information from the feedback to perform tuning correspondingly in order to output a light of a certain wavelength as needed.

In the tunable laser 100, the splitter component 130 and the monitor photodetector (MPD) 140 that are used as the feedback assembly are disposed outside the housing 110, thereby reducing the number of components in the housing 110 and enabling a smaller package size. The volume of the packaged housing 110 may be smaller than 0.3 cm$^3$ or even smaller than 0.2 cm$^3$. Additionally, having the splitter component 130 and the photodetector 140 disposed outside the housing 110 effectively reduces optical components in the housing 110 or in a resonant cavity of the tunable laser, thereby lowering optical insertion loss in the housing 110 or in the resonant cavity. Moreover, coupling the photodetector outside the housing 110 is more convenient than in the housing 110, thus enabling higher coupling efficiency and lower insertion loss, which in turn reduces impact on the output laser power and linewidth.

In the first example embodiment, the tunable semiconductor laser apparatus 150 disposed inside the housing 110 is a free-space external cavity laser. As illustrated in FIG. 2, the tunable semiconductor laser apparatus 150 includes a thermoelectric cooler (TEC) 151, as well as a gain chip 152, a collimating lens 153, a tunable filter assembly 154, a cavity length actuating component 155, an isolator 156, and a coupling lens 157 disposed on the TEC 151. A first cavity surface of the external resonant cavity of the external cavity laser is disposed at an end surface of the gain chip 152 away from the collimating lens 153, and a second cavity surface of the external cavity is disposed at a flat surface of the isolator 156 near the tunable filter assembly 154. The first cavity surface of the external resonant cavity disposed at the gain chip 152 is a totally reflective surface, and the second cavity surface of the external resonant cavity disposed at the isolator 156 is a partially reflective surface. The cavity length actuating component 155 is disposed between two filters of the tunable filter assembly 154. The isolator 156 is disposed in a stacked piezoelectric ceramic 158 and the stacked piezoelectric ceramic 158 serves as an actuator to cause the second cavity surface to dither and thereby generate a dither signal. A light beam emitted by the gain chip 152 is collimated by the collimating lens 153 and then travels to the tunable filter assembly 154. The light that has transmitted through the tunable filter assembly 154 travels to the partially reflective surface on the isolator 156, and the reflected light returns along the same path and resonates in the external resonant cavity to form a laser mode. A control signal controls the cavity length actuating component 155 to tune the laser mode by changing the optical cavity length of the external resonant cavity, so that the laser mode needed aligns with the wavelength selected by the tunable filter assembly 154. The control signal also controls the stacked piezoelectric ceramic 158 to dither so that the second cavity surface of the external resonant cavity at the isolator 156 disposed in the stacked piezoelectric ceramic 158 dithers to generate a dither signal. In this way, the optical power received by the Tap-PD 130/140 disposed outside the housing 110 will dither at the same frequency as the frequency of the dither signal, and be converted to an electrical signal that is transmitted to the processor. The processor processes the electrical signal by, for example, taking the first derivative, to lock at a point where the power is maximum, and provides feedback to the controller to lock the wavelength of the output light from the tunable laser 100 at the wavelength where the optical power is maximum.

In another example embodiment, the aforementioned tunable semiconductor laser apparatus 150 may alternatively be an external cavity laser of another structure, for example, with the positions of the isolator 156 and coupling lens 157 swapped, or with both the dither and cavity length controls integrated on the stacked piezoelectric ceramic 158, or with the stacked piezoelectric ceramic replaced by another actuator. Or, the tunable semiconductor laser apparatus may alternatively be a semiconductor laser chip, such as a DBR (distributed Bragg reflector) laser, that integrates the functions of wavelength selection and phase adjustment.

Second Example Embodiment

Figure 3:
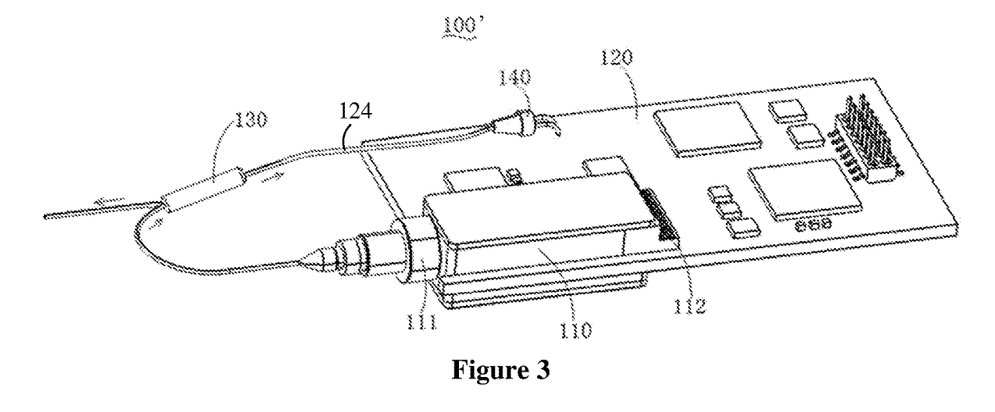
FIG. 3 is a diagram illustrating a tunable laser according to a second example embodiment of the present disclosure.

FIG. 3 is a diagram illustrating a tunable laser 100' according to a second example embodiment of the present disclosure. As illustrated in FIG. 3, the second example embodiment differs from the first example embodiment in that the splitter component 130 is a fiber optic splitter (hereinafter referred to as "fiber optic splitter 130"), for example, a 1×2 planar optical waveguide splitter (PLC (planer lightwave circuit) splitter) or fused fiber splitter. The fiber optic splitter 130 is connected to the photodetector 140 by means of an optical fiber 124, and the photodetector 140 is disposed on and electrically connected to the circuit board 120. An input port of the fiber optic splitter 130 is connected to the optical interface 111 at one end of the housing 110. The fiber optic splitter 130 splits the optical signal outputted from the optical interface 111 into two portions: the portion that has higher power serves as a signal light and is outputted; the portion that has lower power serves as a monitor light and travels to the photodetector 140, which receives the monitor light, converts the monitor light to an electrical signal, and transmits the electrical signal to the processor on the circuit board 120. In the second example embodiment, the optical power of the monitor light may similarly account for 0.5% to 10% of the optical power of the optical signal outputted from the optical interface 111. In the second example embodiment, 1% to 2% of the optical power of the light that resulted from the splitting by the fiber optic splitter 130 serves as the monitor light, and the remaining 98% to 99% of the optical power of the light serves as the signal light for output. The use of the fiber optic splitter 130 keeps the cost low and enables a flexible spatial layout, allowing for a reasonable spatial layout adapted to the use of the tunable laser 100, thereby further reducing the overall volume of the tunable laser 100.

In operation, electrical signals such as drive and control signals on the circuit board 120 are inputted into the housing 110 through the electrical interface 112. The electrical signals control the tunable semiconductor laser apparatus 150 to emit an optical signal, which is outputted through the optical interface 111. The optical signal outputted from the optical interface 111 is split into two beams of light by the fiber optic splitter 130: the beam that has higher power serves as the signal light, and the beam that has lower power serves as the monitor light. The monitor light travels to the photodetector 140 located behind the fiber optic splitter 130 and is used to monitor the optical signal emitted by the tunable semiconductor laser apparatus 150. The photodetector 140 converts the received monitor light into an electrical signal and transmits the electrical signal to the processor on the circuit board 120. The electrical signal is analyzed and processed by the processor and then fed back to the controller, and the controller controls the tunable semiconductor laser apparatus 150 according to the information from the feedback to perform tuning correspondingly in order to output a light of a certain wavelength as needed.

Third Example Embodiment

Figure 4:
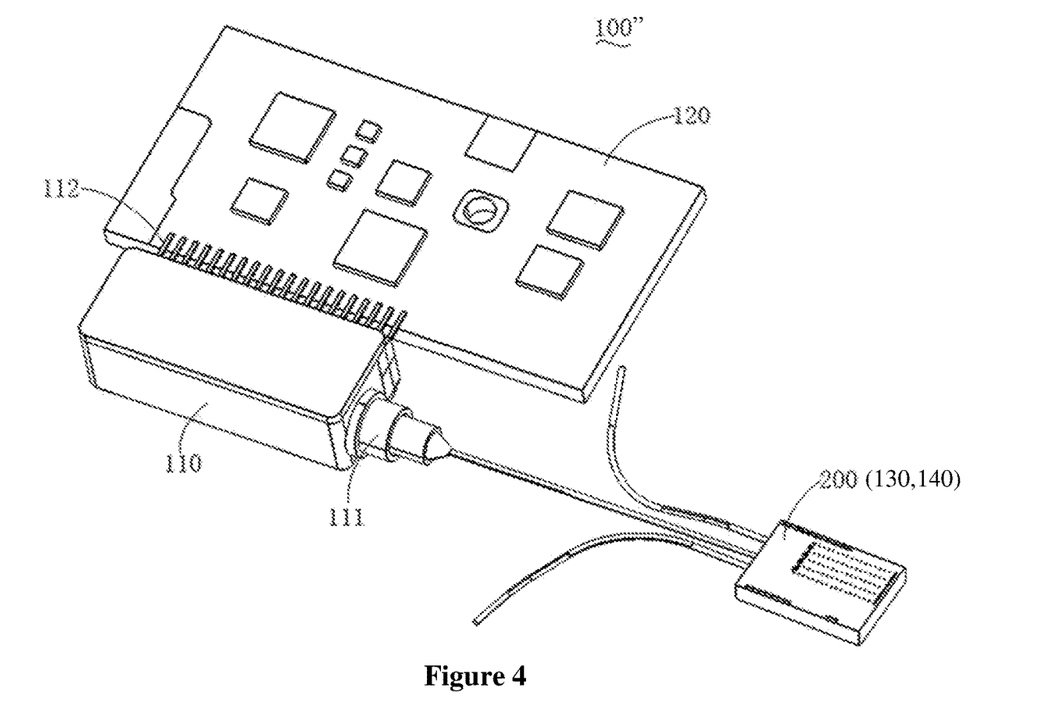
FIG. 4 is a diagram illustrating a tunable laser according to a third example embodiment of the present disclosure.
Figure 5:
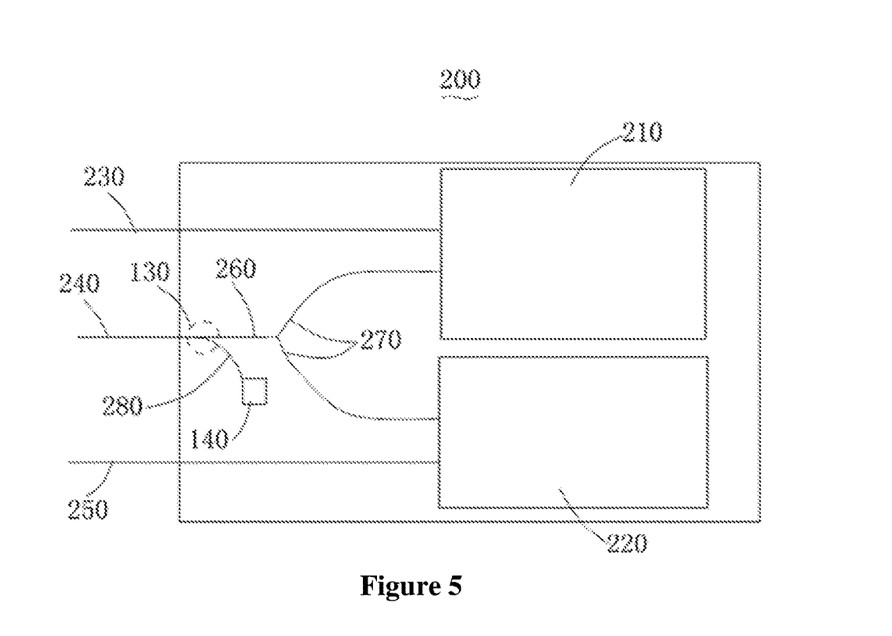
FIG. 5 is a diagram illustrating a photonic integrated circuit in a tunable laser according to the third example embodiment of the present disclosure.

FIG. 4 is a diagram illustrating a tunable laser 100" according to a third example embodiment of the present disclosure. FIG. 5 illustrates a photonic integrated circuit (PIC) chip 200 used in a tunable laser of a coherent optical module, according to the third example embodiment of the present disclosure. As illustrated in FIGS. 4 and 5, the third example embodiment differs from the first example embodiment in that the splitter component 130 and the photodetector 140 are integrated in the photonic integrated circuit chip 200 made of silicon, the electrical interface 112 is disposed at one side wall of the housing 110, and the tunable semiconductor laser apparatus is electrically connected to the circuit board 120 by means of the electrical interface 112 on the side wall of the housing 110. The splitter component 130 is made by fabricating a bypass optical waveguide on an optical waveguide of the photonic integrated circuit chip 200. The photodetector 140 is fabricated in the bypass optical waveguide. The result is a very small chip, thereby enabling further reduction in the overall volume of the part. With the silicon photonic chip integration technique, when the tunable laser 100" is used in an optical module, the splitter component 130 and the photodetector 140 may be integrated in a photonic integrated circuit (PIC) that is in an optical module and integrates other parts, such as an optical modulator, thereby enabling further improvement in the level of integration of the part and reduction in the overall volume of the part.

In the example embodiment illustrated in FIG. 5, the splitter component 130 and the photodetector 140 are integrated in the photonic integrated circuit chip 200 of an optical module. Specifically, the photonic integrated circuit chip 200 includes an optical modulator 210 and an optical receiver 220 that are integrated together, a signal output port 230 connected to the optical modulator 210, a signal input port 250 connected to the optical receiver 220, and a laser input port 240. The laser input port 240 connects to a main optical path 260 which connects to two branch optical paths 270. The two branch optical paths 270 are connected to the optical modulator 210 and the optical receiver 220, respectively. The splitter component 130 is integrated in the aforementioned main optical path 260 to branch out a monitor branch optical path 280 from the main optical path 260. The monitor branch optical path 280 is connected to the photodetector 140 which is used to receive a monitor light. In the third example embodiment, the main optical path 260 is a main optical waveguide in the PIC chip 200, and the monitor branch optical path 280 is a bypass optical waveguide on the main optical waveguide. After the bypass optical waveguide, the main optical waveguide is branched into two branch optical waveguides which serve as the two branch optical paths 270, respectively.

In the photonic integrated circuit chip 200, the laser input port 240 is used to receive a light beam outputted from the optical interface 111 of the tunable laser 100. On the main optical path 260, the light received has a small portion split out by the monitor branch optical path 280 to serve as the monitor light, which goes to the photodetector 140 and is used to monitor the optical signal outputted from the tunable laser 100. The optical power of the small portion, which is the monitor light, may account for 0.5% to 10% of the optical power outputted from the optical interface 111 of the tunable laser 100. In the third example embodiment, the optical power of the small portion, which is the monitor light, accounts for 1% to 2% of the optical power outputted from the optical interface 111. The remaining 98% to 99% serves as a signal light, which continues to propagate along the main optical path 260 and is split into two portions by the two branch optical paths 270 by a splitter different from the splitter component 130: one of the two portions is inputted into the optical modulator 210 and, after modulation by the optical modulator 210, is outputted through the signal output port 230; the other portion is inputted into the optical receiver 220 for mixed-frequency demodulation with an external signal light received by the signal input port 250.

Fourth Example Embodiment

Figure 6:
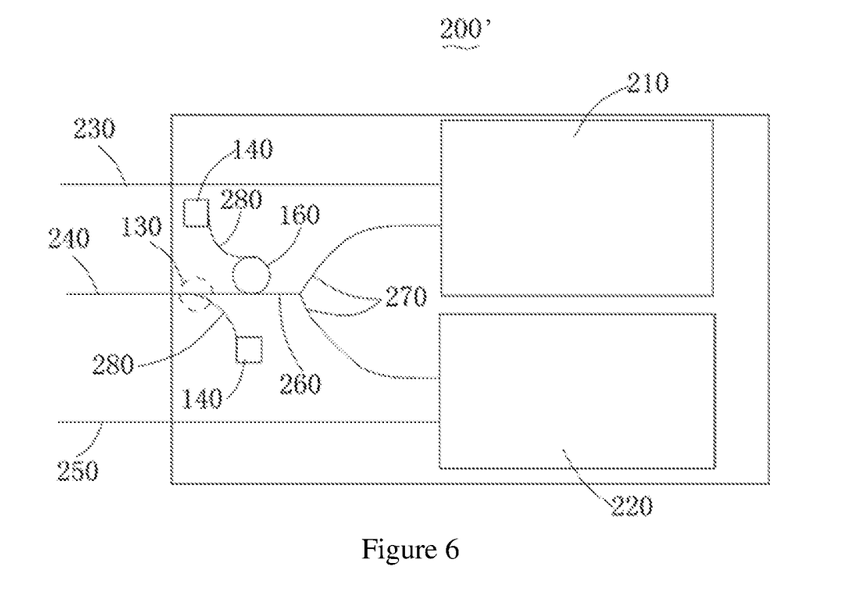
FIG. 6 is a diagram illustrating a photonic integrated circuit in a tunable laser according to a fourth example embodiment of the present disclosure.

FIG. 6 is a diagram illustrating a photonic integrated circuit chip 200' of the tunable laser 100 according to a fourth example embodiment of the present disclosure. In the fourth example embodiment, the splitter component 130 and the photodetector 140 are similarly integrated in the photonic integrated circuit chip 200' of the optical module. The fourth example embodiment differs from the third example embodiment in that two monitor branch optical paths 280 and two photodetectors 140 are disposed on the main optical path 260 of the photonic integrated circuit chip 200'. The two monitor branch optical paths 280 are connected respectively to the two photodetectors 140. One of the monitor branch optical paths 280 further has a fixed-grid filter 160 disposed therein. Here, the fixed-grid filter 160 may be provided as a fixed-grid filter micro-ring. The optical power of each of the two monitor lights that are produced through splitting by the two monitor branch optical paths 280 accounts for 1% to 2% of the optical power outputted from the optical interface.

In addition, the tunable semiconductor laser apparatus 150 according to the fourth example embodiment is different from the tunable semiconductor laser apparatus 150 in any of the aforementioned example embodiments. In the fourth example embodiment, the tunable semiconductor laser apparatus 150 does not need a dither component, and the rest of its structure is the same as the tunable semiconductor laser apparatus 150 of the first example embodiment. In the fourth example embodiment, the locking of the wavelength of the output light can be achieved by adjusting the phase of the output light from the tunable semiconductor laser apparatus 150 and monitoring the optical powers of the two monitor lights with the two photodetectors 140 until the optical powers monitored by the two photodetectors 140 reach a target ratio (for example, 1:1). The tunable semiconductor laser apparatus 150 omits the dither component, thereby enabling further reduction in package size.

In another example embodiment, the splitter component 130 and the photodetector 140 may utilize a fiber optic splitter and two photodetectors, respectively, similar to that of the second example embodiment. For example, a 1×3 planar optical waveguide splitter (PLC splitter) or fused fiber splitter may be connected to two photodetectors, respectively, by means of optical fibers, and the two photodetectors may disposed on and electrically connected to the circuit board. A fixed-grid filter is further disposed between one of the photodetectors and the fiber optic splitter. An input port of the fiber optic splitter is connected to the optical interface at one end of the housing. The fiber optic splitter splits the optical signal outputted from the optical interface into three portions: the portion that has higher power serves as a signal light and is outputted; the two portions that have lower powers serve as monitor lights. One of the monitor lights directly travels to the photodetector; the other monitor light travels to the fixed-grid filter and is filtered by the fixed-grid filter, then the filtered monitor light travels to the photodetector. The photodetector receives the monitor light, converts it to an electrical signal, and transmits the electrical signal to the processor on the circuit board. The processor processes the two electrical signals separately and compares them in order to lock the wavelength.

Fifth Example Embodiment

A fifth example embodiment of the present disclosure provides an optical module, including an outer housing, a module circuit board, and a tunable laser. The tunable laser may be the tunable laser of any one of the aforementioned Example Embodiments 1 through 4.

Figure 7:
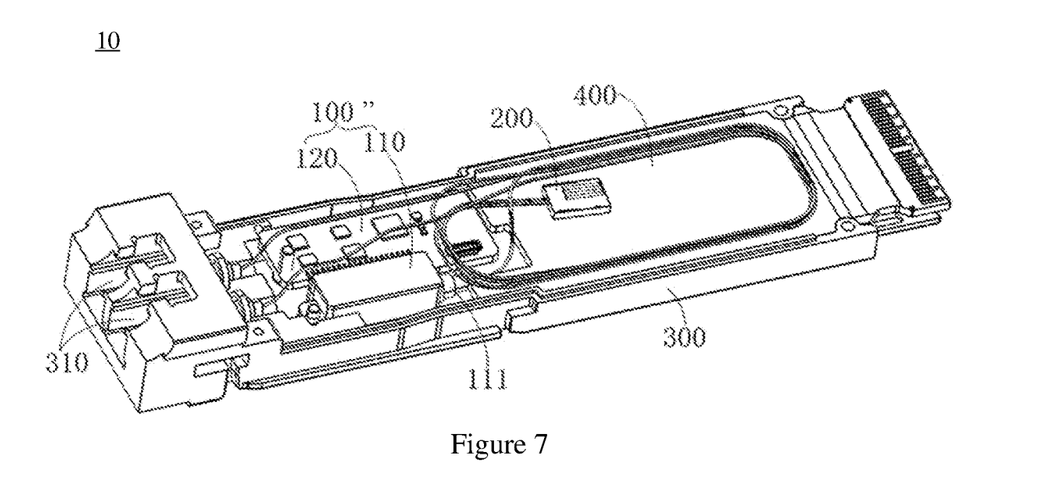
FIG. 7 is a diagram illustrating an optical module according to a fifth example embodiment of the present disclosure.

FIG. 7 is a diagram illustrating an optical module 10 according to the fifth example embodiment of the present disclosure. As illustrated in FIG. 7, in the fifth example embodiment, the optical module 10 includes an outer housing 300, as well as a module circuit board 400, a photonic integrated circuit chip 200, and a tunable laser 100 that are disposed inside the outer housing 300. The outer housing 300 has two optical interfaces 310 disposed at its end: an optical input interface and an optical output interface. In the fifth example embodiment, the tunable laser 100" is the tunable laser of the third example embodiment. As illustrated in FIG. 5, its splitter component 130 and photodetector 140 are integrated in the photonic integrated circuit chip 200 of the optical module 10. As illustrated in FIGS. 5 and 7, the circuit board 120 of the tunable laser 100" is electrically connected to the module circuit board 400, and the photonic integrated circuit chip 200 is electrically connected to the module circuit board 400. In another example embodiment, the circuit board 120 of the tunable laser 100" and the module circuit board 400 may be integrated as a single one-piece circuit board. The photonic integrated circuit chip 200 includes an optical modulator 210 and an optical receiver 220 that are integrated together, a signal output port 230 connected to the optical modulator 210, a signal input port 250 connected to the optical receiver 220, and a laser input port 240. The laser input port 240 connects to a main optical path 260 which connects to two branch optical paths 270, and the two branch optical paths 270 are connected to the optical modulator 210 and the optical receiver 220, respectively. The splitter component 130 is integrated in the aforementioned main optical path 260 to branch out a monitor branch optical path 280 from the main optical path 260. The monitor branch optical path 280 is connected to the photodetector 140 which is used to receive a monitor light. The integration of the splitter component 130 and the photodetector 140 of the tunable laser 100" on the photonic integrated circuit chip 200 of the optical module 10 further improves the level of integration of the part and reduces the overall volume of the module.

In the optical module 10, the signal output port 230 is connected to the optical output interface on the outer housing 300 by means of an optical fiber, and the signal input port 250 is connected to the optical input interface on the outer housing 300 by means of an optical fiber. The laser input port 240 is used to receive a light beam outputted from the optical interface 111 of the tunable laser 100". In the main optical path 260, the light received has a small portion split out by the monitor branch optical path 280 to serve as a monitor light, which goes to the photodetector 140 and is used to monitor the optical signal outputted from the tunable laser 100". The optical power of this small portion, which is the monitor light, may account for 0.5% to 10% of the optical power outputted from the optical interface of the tunable laser. In the fifth example embodiment, the optical power of this small portion, which is the monitor light, accounts for 1% to 2% of the optical power outputted from the optical interface. The remaining 98% to 99% serves as a signal light, which continues to propagate along the main optical path 260 and is split into two portions by the two branch optical paths 270. One of the two portions is inputted into the optical modulator 210 and, after modulation by the optical modulator 210, is outputted through the signal output port 230. The other portion is inputted into the optical receiver 220 for mixed-frequency demodulation with an external signal light received by the signal input port 250.

Embodiments of the present disclosure provide the following benefits. Placing the monitor photodetector 140 outside the sealed housing 110 reduces the number of components in the housing 110 and realizes a smaller package size. In addition, coupling of the monitor photodetector 140 outside the housing 110 is more convenient, thus enabling higher coupling efficiency and lower insertion loss, which reduces impact on the output laser power and linewidth The series of detailed descriptions above is only intended to provide specific descriptions of feasible embodiments of the present disclosure. They are not to be construed as limiting the scope of protection for the present disclosure; all equivalent embodiments or changes that are not detached from the techniques of the present disclosure in essence should fall under the scope of protection of the present disclosure.

What is claimed is:

1. A tunable laser, comprises:
a housing having a sealable accommodating cavity;
an optical interface disposed at one end of the housing;
an electrical interface disposed at another end or a side of the housing;
a tunable semiconductor laser apparatus disposed in the accommodating cavity and configured to emit an optical signal whose wavelength is tunable, a drive signal inputted through the electrical interface controlling the tunable semiconductor laser apparatus to emit the optical signal, the optical signal being outputted through the optical interface, wherein the tunable semiconductor laser apparatus is a free-space external cavity laser disposed on a thermoelectric cooler, the free-space external resonant cavity laser includes an external resonant cavity which includes a totally reflective surface as a first cavity surface and a partially reflective surface as a second cavity surface, and the free-space external cavity laser includes a gain chip, a collimating lens, a tunable filter assembly, and a cavity length actuating component;
a controller configured to control the second cavity surface to dither and generate a dither signal;
a splitter component disposed outside the housing and configured to split the optical signal outputted through the optical interface into two beams of light;
a photodetector disposed outside the housing and configured to receive one of the two beams of light to monitor the optical signal emitted by the tunable semiconductor laser apparatus to detect the dither signal, and convert the dither signal to an electrical signal; and
a processor configured to receive and process the electrical signal to lock at a point where an optical power is maximum, and provide feedback to the controller to lock the wavelength of the output light from the tunable laser at the wavelength where the optical power is maximum.

2. The tunable laser of claim 1, wherein the tunable laser further comprises:
a circuit board disposed outside the housing and electrically connected to the electrical interface, the processor and the controller being disposed on the circuit board, the photodetector being disposed on or beside, and electrically connected to, the circuit board.

3. The tunable laser of claim 2, wherein the splitter component and the photodetector are packaged in a Tap Photo Detector (Tap-PD), and the Tap-PD is disposed on or beside the circuit board.

4. The tunable laser of claim 1, wherein an optical power of the one of the two beams of light that results from the splitting by the splitter component and is used for monitoring accounts for 0.5% to 10% of an optical power of the optical signal outputted from the optical interface.

5. The tunable laser of claim 1, wherein the splitter component is optically connected to the optical interface by a fiber.

* * * * *